United States Patent [19]

Reisman et al.

[11] Patent Number: 5,025,304

[45] Date of Patent: Jun. 18, 1991

[54] HIGH DENSITY SEMICONDUCTOR STRUCTURE AND METHOD OF MAKING THE SAME

[75] Inventors: Arnold Reisman; Iwona Turlik, both of Raleigh, N.C.

[73] Assignees: MCNC, Research Triangle Park, N.C.; Northern Telecom Limited, Montreal, Canada

[21] Appl. No.: 277,607

[22] Filed: Nov. 29, 1988

[51] Int. Cl.[5] .................................................. H01L 23/48
[52] U.S. Cl. ........................................ 357/71; 357/67; 357/65
[58] Field of Search ........................ 357/67, 68, 71, 65

[56] References Cited

U.S. PATENT DOCUMENTS

| 3,725,743 | 4/1973 | Murayama | 317/101 |
|---|---|---|---|
| 3,766,445 | 10/1973 | Reuter et al. | 317/235 |
| 4,200,474 | 4/1980 | Morris | 148/1.5 |
| 4,245,768 | 4/1981 | Sater | 228/116 |
| 4,288,270 | 9/1981 | Bate et al. | 427/88 |
| 4,411,962 | 10/1983 | Johnson | 428/615 |
| 4,481,283 | 11/1984 | Kerr et al. | 430/319 |
| 4,495,219 | 1/1985 | Kato et al. | 427/82 |
| 4,596,604 | 6/1986 | Akiyama et al. | 148/1.5 |
| 4,636,833 | 1/1987 | Nishioka et al. | 357/71 |
| 4,704,512 | 11/1987 | Lisec | 219/101 |
| 4,732,312 | 3/1988 | Kennedy et al. | 228/157 |

FOREIGN PATENT DOCUMENTS

| 58-103149 | 6/1983 | Japan | 357/75 |
|---|---|---|---|
| 60-21553 | 2/1985 | Japan | 357/59 E |
| 60-117690 | 6/1985 | Japan | 357/4 |
| 62-145850 | 6/1987 | Japan | 357/59 E |
| 63-260054 | 10/1988 | Japan | 357/71 |

OTHER PUBLICATIONS

Thomas R. Anthony, "Dielectric Isolation of Silicon by Anodic Bonding", Aug. 1, 1985, Journal of Applied Physics, pp. 1240–1247.

W. P. Mazara, G. Goetz, A. Caviglia and J. B. McKittrick, "Bonding of Silicon Wafers for Silicon–On Insulator", for Bendix Aerospace Technology Center, Undated.

*Primary Examiner*—Andrew J. James
*Assistant Examiner*—D. Monin
*Attorney, Agent, or Firm*—Bell, Seltzer, Park & Gibson

[57] ABSTRACT

A method of forming a high density semiconductor structure including one or more buried metal layers. One or more metal layers may be formed on a first semiconductor substrate, with the metal layer or layers being insulated from one another and from the substrate. One or more metal layers may be formed on the surface of a second substrate which may or may not be a semiconductor substrate. The topmost metal layers, either or both of which may have an insulating layer thereon, are placed in contact and heated in an oxidizing ambient atmosphere to form a bond therebetween. One or more vias connect the buried metal layers to the active devices in the substrates. The buried metal layers may form buried power and ground planes and buried metallization patterns for device interconnection.

3 Claims, 2 Drawing Sheets

HIGH DENSITY SEMICONDUCTOR STRUCTURE AND METHOD OF MAKING THE SAME

FIELD OF THE INVENTION

This invention relates to the fabrication of semiconductor wafers for subsequent formation into semiconductor and integrated circuit devices, and more specifically to a semiconductor structure in which high density devices and high density device interconnection patterns may be formed, and to a method of fabricating such a structure.

BACKGROUND OF THE INVENTION

High density semiconductor fabrication techniques are required for the manufacture of Very Large Scale Integration (VLSI) and Ultra Large Scale Integration (ULSI) chips having up to several million devices thereon. High density chips may be fabricated by shrinking the size of the individual devices on the chips so that more devices per unit area may be formed. When device sizes shrink, however, it becomes more difficult to provide interconnection between devices. If small size devices cannot be connected to one another as required, the benefits of small device size are lost.

The art has provided many techniques for forming dense metal interconnection patterns for device interconnection. High density VLSI and ULSI devices typically require multiple levels of surface metallization in order to accommodate their complex wiring patterns. Unfortunately, multiple level metallization creates planarity problems in the metallization layers, thereby limiting interconnection density. Complex process steps are also needed to provide multiple levels of metallization.

Another concern in shrinking device size is the difficulty of providing adequate isolation between devices. Semiconductor On Insulator (SOI) technology may be employed to enhance isolation between devices. One method for fabricating an SOI structure oxidizes first and second silicon substrates to form a layer of silicon dioxide ($SiO_2$) on each. The silicon dioxide surfaces are bonded together face-to-face to form a unified structure. Most of the silicon may be etched from one of the wafers until only several micrometers of silicon remain. Devices are then formed in this thin film of silicon. Another version of this type of silicon oxide bonding technique is disclosed in an article by Laskey entitled "Wafer Bonding for Silicon-on-Insulator Technologies," Applied Physics Letters, Vol. 48, No. 1, Jan. 6, 1986. Other examples of silicon oxide bonding techniques are disclosed in U.S. Pat. No. 3,997,381 to Wanlass, and in U.S. Pat. No. 4,601,779 to Abernathy et al.

SUMMARY OF THE INVENTION

In accordance with the foregoing, it is an object of the present invention to provide a method of fabricating a high density semiconductor structure.

It is another object of the present invention to provide a method of making a high density semiconductor structure in which high density interconnection patterns may be formed.

It is yet another object of the present invention to provide a method of making a high density semiconductor structure which maintains a high degree of device isolation.

These and other objects are met according to the present invention by providing a metal to metal bonding technique for joining two substrates to form a semiconductor structure, while at the same time providing a buried metal layer within the device for device interconnection. The very same metal layer which forms the bond for a semiconductor device also forms at least part of the device interconnection pattern. Surface metallization patterns are thus simplified, resulting in high density devices with high density interconnection patterns.

According to the present invention, one or more metal layers are formed on a first semiconductor substrate, with the metal layer or layers being insulated from one another and from the substrate except at desired contacting regions. One or more metal layers are formed on a second substrate which may or may not be a semiconductor substrate. The topmost metal layer on the two substrates are placed against one another, and are heated in an oxidizing ambient atmosphere to form a bond therebetween. Either or both of the topmost metal layers may include an oxide layer on the surface thereof. Devices may then be formed in the first semiconductor substrate and in the second substrate if it is also a semiconductor substrate.

The structure formed according to the present invention includes a semiconductor substrate with one or more buried metal layers, or two semiconductor substrates with one or more buried metal layers therebetween. The buried metal layers of the present invention not only form part of the metal to metal bond, but also form part of the device interconnection metallization, so that all of the device interconnection need not be accomplished with surface metallization. Fewer surface metallization layers may be employed, resulting in denser interconnection patterns. In this regard, some of the buried metal layers may be planar layers for use as a ground or power plane, or as a radiation hardening shield. Alternatively, or in addition to planar layers, patterned layers may be formed for device interconnection. The buried metal layers together with the buried insulator regions may also form one or more buried capacitors for use with the active devices. It will be understood by those having skill in the art that the buried metal layers may be connected to one another and to the devices in the first substrate (and the second substrate if semiconductor), using metal vias which run through the insulating layers between buried metal layers, or using sloped contacts between buried metal layers. Well known techniques may be employed to form these vias or sloped contacts. External connections may also be employed instead of, or in addition to, the internal vias or sloped contacts.

The buried metal layers of the present invention may be metal or metal alloy. They need not all be of the same metal. The metal-to-metal bonding may bond the two metal layers to form a single metal layer. Alternatively, an oxide bonding layer sufficiently thick to form an insulator between the topmost metal layers may be formed.

The present invention may also be employed to form a semiconductor on insulator structure having one or more buried layers. In order to form a semiconductor on insulator structure, the first semiconductor substrate is formed by epitaxial deposition on a first substrate. The metal layer or layers as described above are then formed on the epitaxial layer. After bonding, the first substrate is removed, to expose the epitaxial layer. Similar steps may be employed with the second substrate, if semiconductor. In a preferred embodiment of the invention, the epitaxial layer on the substrate is a heteroepitaxial layer, so that the substrate may be easily etched after bonding to expose the heteroepitaxial layer. As is well known to those having skill in the art, the epitaxial growth process is a means for depositing a thin layer of a single crystal material on a single crystal substrate. If the film is the same material as the substrate (for example silicon deposition on a silicon substrate), the process is called homoepitaxy. If, on the other hand, the deposit is made on a substrate that is chemically different (for example silicon deposition on a non-silicon substrate), the process is called heteroepitaxy. By providing chemically different materials for the substrate and epitaxial layer, removal of the substrate is facilitated.

DETAILED DESCRIPTION OF THE INVENTION

The present invention now will be described more fully hereinafter with reference to the accompanying drawings, in which a preferred embodiment of the invention is shown. This invention may, however, be embodied in many different forms and should not be construed as limited to the embodiment set forth herein; rather, applicants provide this embodiment so that this disclosure will be thorough and complete, and will fully convey the scope of the invention to those skilled in the art.

Like characters refer to like elements throughout. For greater clarity, the thickness of layers has been exaggerated.

Figure 1A:
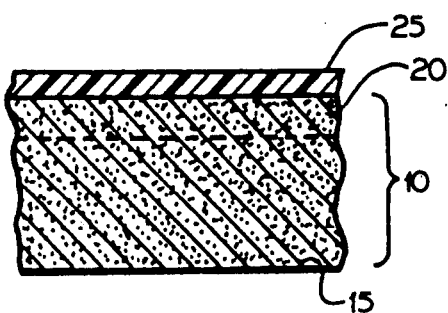
FIGS. 1A–1D are cross-sectional views schematically illustrating certain stages of a first embodiment of the present invention.

Referring to FIGS. 1A–1D, a first method of forming a high density semiconductor structure according to the present invention is shown. In FIG. 1A, a first semiconductor substrate 10 of silicon or a semiconductor material other than silicon has grown or formed thereon a first insulating layer 25, for example a grown layer of silicon dioxide, 0.1–1.0 $\mu$m thick. In order to form a semiconductor on insulator structure, rather than a conventional semiconductor structure, substrate 10 may be formed by forming a thin monocrystalline epitaxial layer 20, preferably 0.1 to 1.0 $\mu$m thick, on a first substrate 15. In one embodiment of the invention, epitaxial layer 20 is a homoepitaxial layer formed on substrate 15. For example, a silicon homoepitaxial layer may be formed on a substrate in the manner disclosed in the above-referenced patents to Wanless and Abernathy, et al., or using other conventional techniques. The use of a homoepitaxial layer makes it difficult to etch the substrate 15 without also etching into the epitaxial layer 20. Accordingly, a preferred embodiment of the present invention employs a silicon heteroepitaxial layer as disclosed in application Ser. No. 277,617 entitled, "Method of Forming a Thin Silicon Layer on an Insulator," the disclosure of which is hereby expressly incorporated by reference, or a non-silicon heteroepitaxial layer 20 as disclosed in application Ser. No. 277,168 entitled, "Method of Forming a Non-Silicon Semiconductor on Insulator Structure," the disclosure of which is hereby expressly incorporated by reference.

Figure 1B:
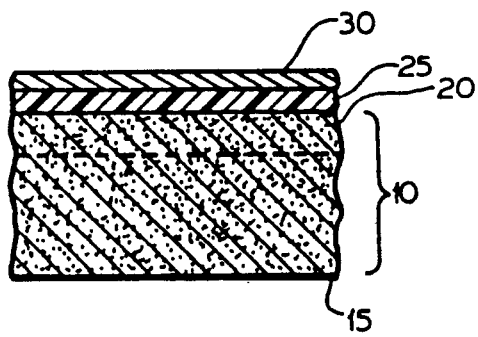

Referring now to FIG. 1B, a metal layer 30, preferably 0.1 to 1.0 $\mu$m thick, such as titanium, aluminum or a metal alloy, is then grown or formed on the insulating layer 25. It will be understood by those having skill in the art that insulating layer 25 protects epitaxial layer 20 from contacting metal layer 30 except where desired. Metal layer 30 may take many forms, depending upon its ultimate function in the device. For example, if metal layer 30 will function as a ground plane, a single planar layer may be formed. If metal layer 30 will function as an interconnection pattern, a patterned planar layer may be formed using well known patterning techniques.

Figure 1C:
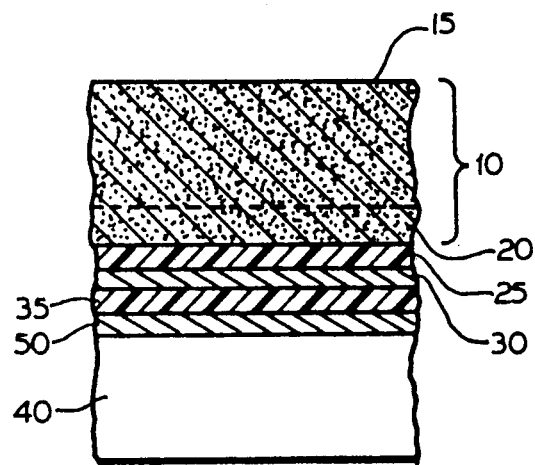

Referring now to FIG. 1C, a second substrate 40, which may or may not be silicon, has a metal layer 50, for example titanium, aluminum or metal alloy, formed thereon, preferably 0.1 to 1.0 $\mu$m thick. Then, metal layer 30 is bonded to metal layer 50 by heating in an oxidizing ambient atmosphere to form a bonding oxide layer 35 between the metal layers 30 and 50. Titanium oxide ($TiO_2$) forms if Ti is used and aluminum oxide ($Al_2O_3$) forms if Al is used. Pressure may be applied to the structures during bonding to aid in the bonding process and provide a higher quality bond.

It will be understood by those having skill in the art that a discrete oxide layer 35 need not be formed during the bonding process. In other words, metal layer 30 may be bonded to metal layer 50 by heating in an oxide ambient atmosphere to bond metal layers 30 and 50 into a single continuous metal layer. If an oxide layer is desired between metal layers 30 and 50, it may be formed in one of the following ways: an oxide layer may be formed on metal layer 30 before bonding; an oxide layer may be formed on metal layer 50 before bonding; oxide layers may be formed on both metal layers 30 and 50 before bonding; or oxide layer 35 may be formed during the bonding process as was described in connection with FIG. 1C.

According to the invention, bonding may take place in a standard annealing furnace or a rapid thermal annealing chamber, both of which are commonly available and will not be described in detail. Preferably, the bonding time for the standard furnace at the annealing temperature is at least 20 minutes, while in a rapid thermal annealing furnace, times between 2–4 minutes may be employed. An ambient atmosphere of dry oxygen and water vapor may be employed. Nitrogen, argon or other unreactive gases may also be employed with oxygen and water. The bonding temperature is preferably between 600° C. to 1150° C.. For example, titanium (Ti) to Ti bonded very well in oxidizing atmospheres at temperatures greater than or near 700° C. in a conventional furnace for twenty minutes.

While Applicants do not wish to be bound by any theory, the chemical bond formation in Ti-Ti structures is believed to result from formation of Ti-0-Ti bonds between two Ti structures. It has been found that these bonds may be formed between two bare metal surfaces which are pressed together as a result of microscopic surface irregularities which allow oxygen to penetrate throughout the interface of the two surfaces. It will be understood by those having skill in the art that this technique of bonding two metallic surfaces via oxidation may be extended to bond other flat and smooth metallic surfaces such as aluminum, or metal alloys.

This method of bonding metal surfaces is disclosed in an application filed concurrently herewith, application Ser. No. 277,620, entitled "Metal-to-Metal Bonding Method and Resulting Structure," the disclosure of which is expressly incorporated herein by reference.

Figure 1D:
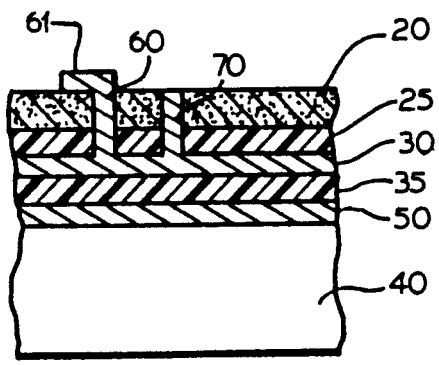

Referring again to FIG. 1C, if a semiconductor on insulator structure is to be formed, substrate 15 is removed or etched using an appropriate acid or any other commonly available etching process such as wet chemistry, plasma or reactive ion etching. For a conventional semiconductor structure, entire substrate 10 may be left intact. Referring now to FIG. 1D, one or more vias are then formed to connect metal layer 30 with the devices in substrate 20, through insulating layer 25. If metal layer 30 is a continuous planar layer, only one via 70 may be necessary. If layer 30 is a patterned interconnection layer, a second via 60 or a large number of vias may be necessary. For purposes of illustration via 70 is shown connecting to a device within layer 20 while via 60 is connected using surface metallization 61. Vias may be formed by etching through layers 20 and 25 after they are formed and filling the etched hole with metal, using well known techniques or by using well known sloped contact techniques. Alternatively, layer 25 may be etched and filled after it is formed (in FIG. 1A) and layer 20 may be etched and filled after bonding (FIG. 1D) using well known self-aligned metallization techniques. Other well-known techniques for forming metal-filled vias in semiconductor devices may also be employed. Alternatively, an external connection between layers 30 and 20, rather than an internal via, may be employed. In either case, a bonded semiconductor or semiconductor on insulator structure is formed, in which a buried metal layer forms the bond between the two substrates, and acts as an interconnection pattern, resulting in a high density device.

Figure 2A:
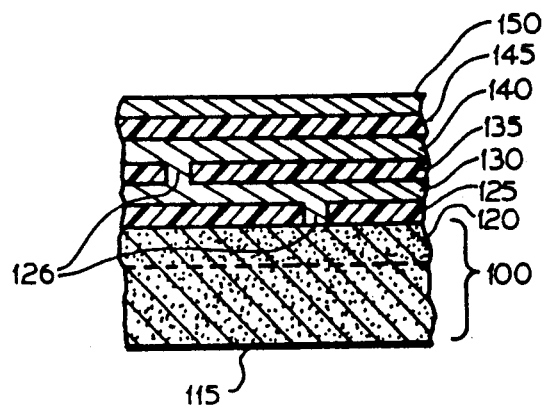
FIGS. 2A–2D are cross-sectional views schematically illustrating certain stages of a second embodiment of the present invention.

Referring to FIGS. 2A-2D, a second method of forming a high density semiconductor structure according to the present invention is shown. In FIG. 2A, a first semiconductor substrate 100 has grown or formed thereon metal layers 130, 140 and 150 with insulating layers 125, 135 and 145 therebetween. The composition and thicknesses of the metal and insulating layers may be as described in connection with FIG. 1. In order to form a semiconductor on insulator structure rather than a conventional semiconductor structure, substrate 100 may be formed by forming a thin monocrystalline epitaxial layer 120 on a first substrate 115. Homoepitaxial or heteroepitaxial deposition may be employed. A plurality of vias 126 selectively connect the metal layers and the substrate. As was described in connection with FIG. 1, the metal layers may be planes or patterned metal layers.

Figure 2B:
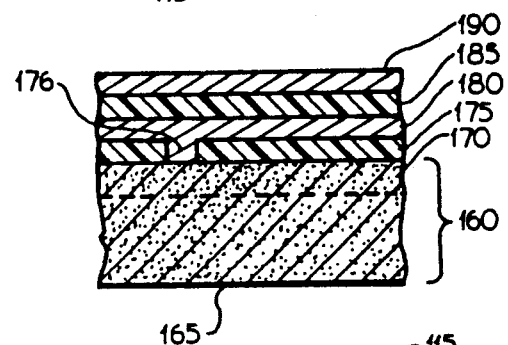
Figure 2C:
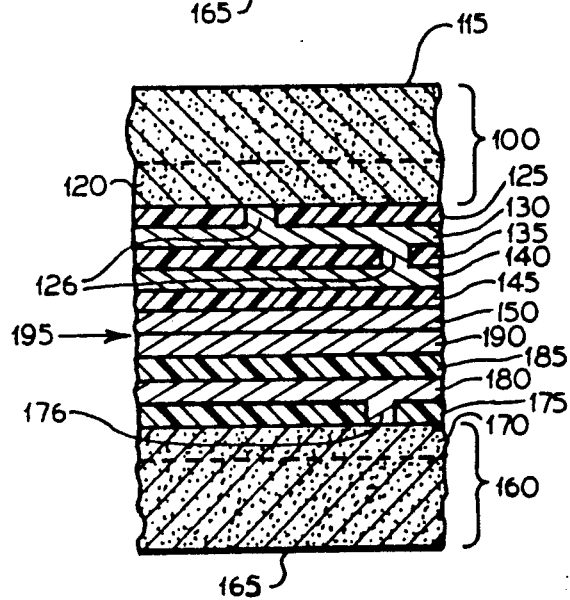

Referring now to FIG. 2B, a second substrate 160 which may or may not be a semiconductor substrate has metal layers 180 and 190 formed thereon with insulating layers 175 and 185 therebetween. As shown in FIG. 2B, substrate 160 is a semiconductor substrate comprising epitaxial layer 170 and substrate 165. For purposes of illustration, one via 176 is shown connecting substrate 170 with buried metal layer 180. Referring now to FIG. 2C, the topmost metal layers 150 and 190 are placed in contact and bonded to one another in a heated oxidizing ambient atmosphere to form a metal-to-metal bond at 195.

Referring now to FIG. 2C, the structure is heated in an oxidizing ambient atmosphere sufficiently long enough to bond metal layers 150 and 190 into a continuous metal layer. As was described in connection with respect to FIG. 1C, either or both metal layers 150 and 190 may have an insulator formed thereon, or an insulating layer may be formed during the bonding process. It will also be understood by those having skill in the art that both substrates 100 and 160 need not include metal layers thereon. Rather, all the required metal layers may be fabricated on substrate 100 or 160.

Figure 2D:
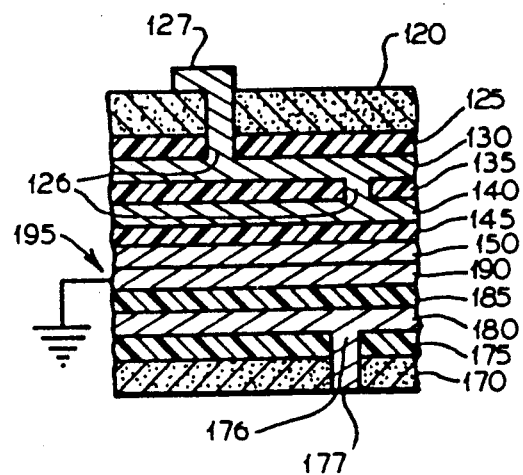

Referring now to FIG. 2D, if one or two semiconductor on insulator structures are to be formed, substrates 115 and/or 165 are removed, as was described in connection with FIG. 1D. Top surface metallization 127 or internal vias 177 may be selectively formed as was described in connection with FIG. 1C. External connections may also be formed. For example, as shown in FIG. 2D, an external ground connection may be applied to buried metal layer 190.

The structure of FIG. 2D includes two semiconductor device layers having a plurality of insulated buried metal layers therebetween. The buried metal layers may form part or all of the device interconnection metallization so that a reduced number of surface metallization layers or no surface metallization layers may be required. The structure of FIG. 2D also forms a single package for the two devices thus connected, thus providing a high density semiconductor structure.

In the drawings and specification, there have been disclosed typical preferred embodiments of the invention and, although specific terms are employed, they are used in a generic and descriptive sense only and not for purposes of limitation, the scope of the invention being set forth in the following claims.

That which we claim is:

1. A buried metal layer semiconductor device comprising:

a substrate;
   first and second buried metal layers on said substrate, said first and second buried metal layers having an oxide bond therebetween, said oxide bond being sufficiently thick to form a first buried insulating layer between said first and second buried metal layers, said first buried insulating layer being an oxide of said first buried metal layer;
   a second buried insulating layer on said second buried metal layer; and,
   a semiconductor layer on said second buried insulating layer.

2. A buried metal layer semiconductor device comprising:

a substrate;
   first and second buried aluminum layers on said substrate, said first and second buried aluminum layers having an aluminum oxide bond therebetween, said aluminum oxide bond being sufficiently thick to form a first buried insulating layer between said first and second buried aluminum layers;
   a second buried insulating layer on said second buried aluminum layer; and,
   a semiconductor layer on said second buried insulating layer.

3. A buried metal layer semiconductor device comprising:

a substrate;
   first and second buried titanium layers on said substrate, said first and second buried titanium layers having a titanium oxide bond therebetween, said titanium oxide bond being sufficiently thick to form a first buried insulating layer between said first and second buried titanium layers;
   a second buried insulating layer on said second buried titanium layer; and,
   a semiconductor layer on said second buried insulating layer.

* * * * *